US008987069B1

(12) United States Patent
Adam et al.

(10) Patent No.: US 8,987,069 B1
(45) Date of Patent: Mar. 24, 2015

(54) SEMICONDUCTOR SUBSTRATE WITH MULTIPLE SIGE REGIONS HAVING DIFFERENT GERMANIUM CONCENTRATIONS BY A SINGLE EPITAXY PROCESS

(71) Applicant: International Business Machines Corporation, Armonk, NY (US)

(72) Inventors: Thomas N. Adam, Slingerlands, NY (US); Kangguo Cheng, Schenectady, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/096,120

(22) Filed: Dec. 4, 2013

(51) Int. Cl.
| | |
|---|---|
| *H01L 21/00* | (2006.01) |
| *H01L 21/84* | (2006.01) |
| *H01L 21/336* | (2006.01) |
| *H01L 21/20* | (2006.01) |
| *H01L 29/161* | (2006.01) |
| *H01L 21/02* | (2006.01) |
| *H01L 29/06* | (2006.01) |
| *H01L 29/10* | (2006.01) |
| *H01L 27/088* | (2006.01) |
| *H01L 21/225* | (2006.01) |
| *C30B 23/02* | (2006.01) |
| *C30B 23/04* | (2006.01) |
| *C30B 23/06* | (2006.01) |

(52) U.S. Cl.
CPC ........ *H01L 29/161* (2013.01); *H01L 21/02532* (2013.01); *H01L 29/0649* (2013.01); *H01L 29/1033* (2013.01); *H01L 27/088* (2013.01); *H01L 21/2251* (2013.01)
USPC ............ 438/149; 438/285; 438/509; 117/105

(58) Field of Classification Search
None
See application file for complete search history.

(56) References Cited

U.S. PATENT DOCUMENTS

| | | | |
|---|---|---|---|
| 6,515,335 B1* | 2/2003 | Christiansen et al. | ........ 257/347 |
| 6,649,492 B2 | 11/2003 | Chu et al. | |
| 6,709,912 B1 | 3/2004 | Ang et al. | |

(Continued)

FOREIGN PATENT DOCUMENTS

JP       2010171282 A       8/2010

*Primary Examiner* — Michael Jung
(74) *Attorney, Agent, or Firm* — Joseph Petrokaitis; L. Jeffrey Kelly

(57) ABSTRACT

A substrate with two SiGe regions having different Germanium concentrations and a method for making the same. The method includes: providing a substrate with at least two active regions; epitaxially depositing a first SiGe layer over each active regions; epitaxially depositing a Silicon layer over each SiGe layer; epitaxially depositing a second SiGe layer over each Silicon layer; forming a hard mask over the second SiGe layer of one of the active regions; removing the epitaxially deposited second SiGe layer of the unmasked active region, removing the hard mask, and thermally mixing the remaining Silicon and SiGe layers of the active regions to form a new SiGe layer with uniform Germanium concentration for each of the active regions, where the new SiGe layer with uniform Germanium concentration of one of the at least two active regions has a different concentration of Germanium than the new SiGe layer with uniform Germanium concentration of the other SiGe layer.

16 Claims, 8 Drawing Sheets

(56) References Cited

U.S. PATENT DOCUMENTS

| | | |
|---|---|---|
| 6,861,304 B2 | 3/2005 | Hisamoto et al. |
| 6,969,875 B2 * | 11/2005 | Fitzgerald ................... 257/192 |
| 7,198,995 B2 | 4/2007 | Chidambarrao et al. |
| 7,547,605 B2 | 6/2009 | Huang |
| 8,110,486 B2 * | 2/2012 | Matsumoto et al. .......... 438/509 |
| 2006/0042542 A1 * | 3/2006 | Bedell et al. .................. 117/105 |
| 2010/0068869 A1 | 3/2010 | Vincent et al. |
| 2012/0038006 A1 | 2/2012 | Zhu et al. |

* cited by examiner

SEMICONDUCTOR SUBSTRATE WITH MULTIPLE SIGE REGIONS HAVING DIFFERENT GERMANIUM CONCENTRATIONS BY A SINGLE EPITAXY PROCESS

BACKGROUND

1. Field of the Invention

The present invention relates to semiconductor structure and semiconductor devices containing germanium, and more particularly, to semiconductor structures and semiconductor devices containing silicon germanium layers.

2. Related Art

For more than three decades, the continued miniaturization of metal oxide semiconductor field effect transistors (MOSFETs) has driven the worldwide semiconductor industry. Various showstoppers to continued scaling have been predicted for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY OF THE INVENTION

One aspect of the Invention is directed to improve device performance and to have different threshold voltages. For example, it may be desirable to use different SiGe channel materials for the different pFETs in a circuit (or nFETs and other devices.); and while it may be desirable to fabricate pFETs with a SiGe channel having, for example, 25% Germanium, it may be desirable to fabricate another set of pFETs with a SiGe channel having, for example, 40% Germanium. Further, different sets of pFETs are often fabricated on the same substrate. Therefore, it may be desirable to form regions of two different pFET, (or another kind of device, i.e. nFET, and/or different sets of devices on the same substrate, i.e. nFETs and pFETS), semiconductor materials on the same substrate.

One aspect of the invention includes a method for preparing a semiconductor substrate with multiple Silicon-Germanium (SiGe) regions having different Germanium concentrations by a single epitaxy process. The method includes: providing an ETSOI substrate with at least two active regions, depositing a first SiGe layer over each of the at least two active regions, depositing a Silicon layer over each of the SiGe layers, depositing a second SiGe layer over each of the Silicon layers, depositing a hard mask over one of the at least two active regions, removing the deposited second SiGe layer of an unmasked active region of the at least two active regions, removing the deposited hard mask over the second SiGe layer of one of the at least two active regions, and thermally mixing the remaining Si and SiGe layers of the at least two active regions to form a new SiGe layer with uniform Germanium concentration for each of the at least two active regions, where the new SiGe layer with uniform Germanium concentration of one of the at least two active regions has a different concentration of Germanium than the new SiGe layer with uniform Germanium concentration of the other SiGe layer.

Yet another aspect includes a method, where the method includes: providing an ETSOI substrate with at least two active regions, epitaxially growing a first SiGe layer over each of the at least two active regions, depositing a Si layer over each of the SiGe layers, epitaxially growing a second SiGe layer over each of the Si layers, depositing a hard mask over one of the at least two active regions, removing the deposited second SiGe layer associated with an unmasked active region of the at least two active regions, removing the deposited hard mask, and thermally mixing the remaining Si and SiGe layers of the at least two active regions to form a new SiGe layer with uniform Germanium concentration for each of the at least two active regions, where the new SiGe layer with uniform Germanium concentration of one of the at least two active regions has a different concentration of Germanium than the new SiGe layer with uniform Germanium concentration of the other SiGe layer, where the deposition of the first SiGe layer, the Si layer, and the second SiGe layer occur in a single epitaxial process run.

Yet another aspect of the invention includes an ETSGOI substrate with at least two active regions, where each of the at least two active regions has a SiGe layer with uniform Germanium concentration, and the Germanium concentration of the SiGe layer of one of the at least two active regions is different than the Germanium concentration of the SiGe layer of the other of at least two active regions.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
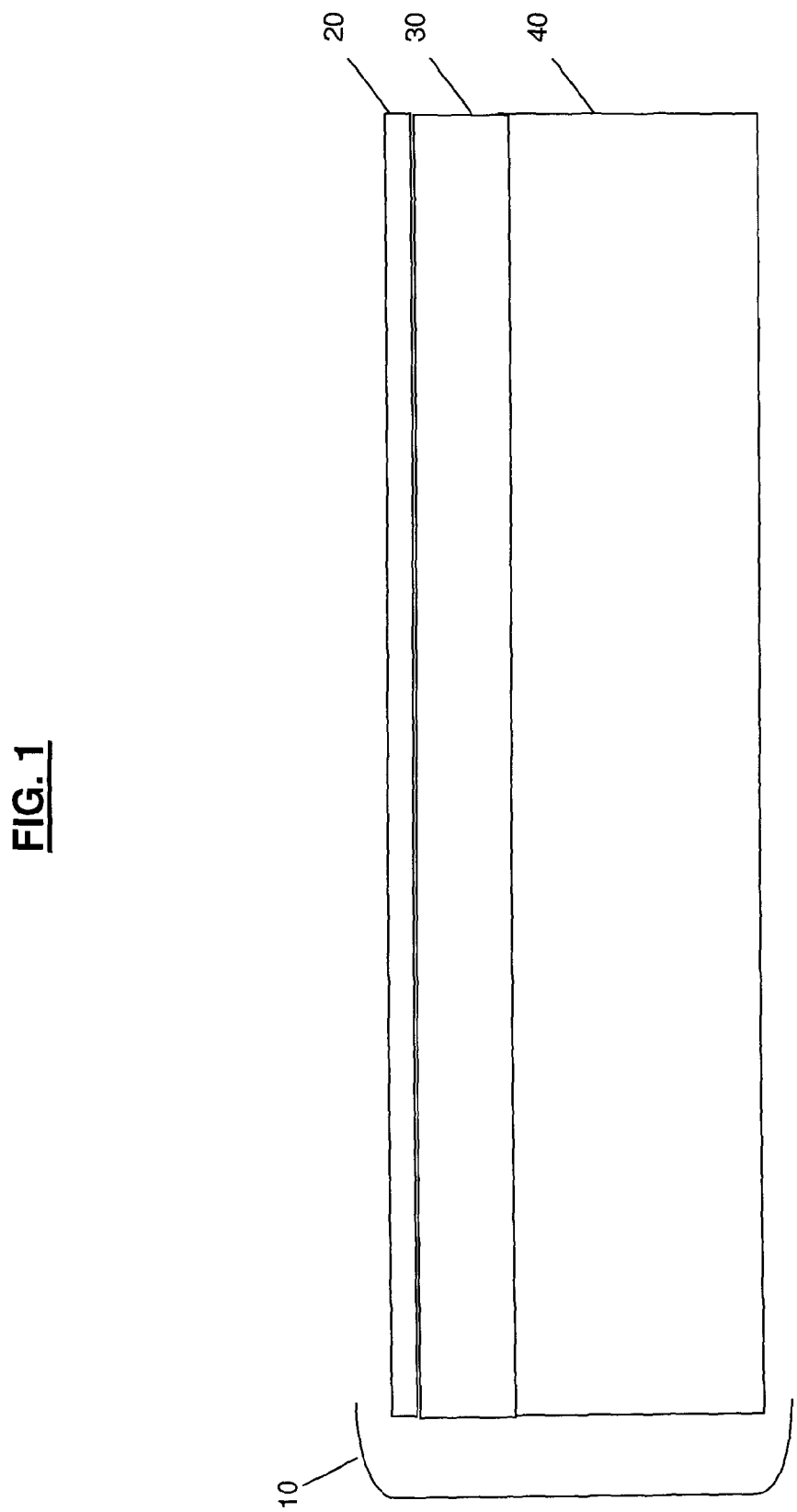
FIG. 1 illustrates a semiconductor structure that can be employed in at least one embodiment of the present application.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF THE PREFERRED EMBODIMENTS

Referring first FIG. 1, there is illustrated a first exemplary semiconductor structure including, from bottom to top, a handle substrate 40, a insulator layer 30 and an semiconductor material layer 20 that can be employed in accordance with an embodiment of the present application. Collectively, the handle substrate 40, the insulator layer 30 and the semiconductor material layer 20 may be referred to as an extremely-thin-semiconductor-on-insulator (ETSOI) substrate 10. The semiconductor material layer 20 may be referred to as the ETSOI portion of the ETSOI substrate 10. Although the present application is described and illustrated utilizing an ETSOI substrate 10, other semiconductor substrates can also be used including, for example, a semiconductor substrate in which handle substrate 40 is omitted.

In the embodiment illustrated in FIG. 1, the semiconductor material layer 20 is present on an uppermost surface of the insulator layer 30. The insulator layer 30 is present on an uppermost surface of the handle substrate 40. The handle substrate 40 provides mechanical support to the insulator layer 30 and the semiconductor material layer 20.

In some embodiments of the present application, the handle substrate 40 and the semiconductor material layer 20 of the ETSOI substrate 10 may comprise a same semiconductor material. In other embodiments of the present application, the handle substrate 40 and the semiconductor material layer 20 of the ETSOI substrate 10 may comprise a different semiconductor material. The term "semiconductor" as used herein in connection with the semiconductor material of the handle substrate 40 and the semiconductor material layer 20 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 40 and the semiconductor material layer 20. In one embodiment, the handle substrate 40 and the semiconductor material layer 20 are both comprised of silicon. In some embodiments, the handle substrate 40 is a non-semiconductor material including, for example, a dielectric material and/or a conductive material.

The handle substrate 40 and the semiconductor material layer 20 may have the same or different crystal orientation. For example, the crystal orientation of the handle substrate 40 and/or the semiconductor material layer 20 may be {100}, {110}, or {111}. Other crystallographic orientations besides those specifically mentioned can also be used in the present application. The handle substrate 40 and/or the semiconductor material layer 20 of the ETSOI substrate 10 may be a single crystalline semiconductor material, a polycrystalline material, or an amorphous material. Typically, at least the semiconductor material layer 20 is a single crystalline semiconductor material. In some embodiments, the semiconductor material layer 20 that is located atop the insulator layer 30 can be processed to include semiconductor regions having different crystal orientations.

The insulator layer 30 of the ETSOI substrate 10 may be a crystalline or non-crystalline oxide or nitride. In one embodiment, the insulator layer 30 is an oxide such as, for example, silicon dioxide. The insulator layer 30 may be continuous or it may be discontinuous. When a discontinuous insulator region is present, the insulator region exists as an isolated island that is surrounded by semiconductor material.

The thickness of semiconductor material layer 20 of the ETSOI substrate 10 is typically from 1 nm to 10 nm, with a thickness from 3 nm to 8 nm being more typical. If the thickness of the semiconductor material layer 20 is not within one of the above mentioned ranges, a thinning step such as, for example, planarization, etching, such as for example, thermal dry or wet oxidation, such as, for example, dry etch or oxidation followed by oxide etch, or any combination thereof, can be used to reduce the thickness of semiconductor material layer 20 to a value within one of the ranges mentioned above.

Preferably, the semiconductor material layer 20 should be thin, i.e. less than 8 nm, and even more preferably between 4 nm and 6 nm (or thinned out as required using the processes described above-) and made of pure Silicon or a material comprising primarily Silicon, although it should be reiterated that other variations are possible, including greater dimensions and different material compositions (as may have been mentioned above).

The insulator layer 30 of the ETSOI substrate 10 typically has a thickness from 1 nm to 200 nm, with a thickness from 100 nm to 150 nm being more typical. The thickness of the handle substrate 40 of the SOI substrate can vary greatly and remain in accordance with the teaching of the present application.

The insulator layer 30 can be a buried dielectric layer 30 and may be composed of any dielectric material. For example, the buried dielectric layer 30 may be composed of an oxide, e.g., silicon oxide, a nitride, e.g., silicon nitride, oxynitrides of silicon, e.g. silicon oxynitride, or a combination thereof. In addition, as already stated, the buried dielectric layer 30 may include crystalline or non-crystalline insulator material. Moreover, the buried dielectric layer 30 may be formed using any of several known methods. Non-limiting examples include ion implantation methods, thermal or plasma oxidation or nitridation methods, chemical vapor deposition methods and physical vapor deposition methods.

The buried dielectric layer 30 may have a thickness of 300 nm or less. In another embodiment, the buried dielectric layer 30 may have a thickness ranging from 2 nm to 150 nm. In yet another embodiment, the buried dielectric layer 30 may have a thickness ranging from 5 nm to 30 nm. Preferably, the buried dielectric layer 30 is a buried oxide layer ("BOX").

The semiconductor material layer 20 may be doped, undoped or contain doped and undoped regions therein. For clarity, the doped regions are not specifically shown in the drawings of the present application. Each doped region within the semiconductor material layer 20 may have the same, or they may have different conductivities and/or doping concentrations. The doped regions that are present in the semiconductor material layer 20 can be formed by ion implantation process or gas phase doping.

Figure 2:
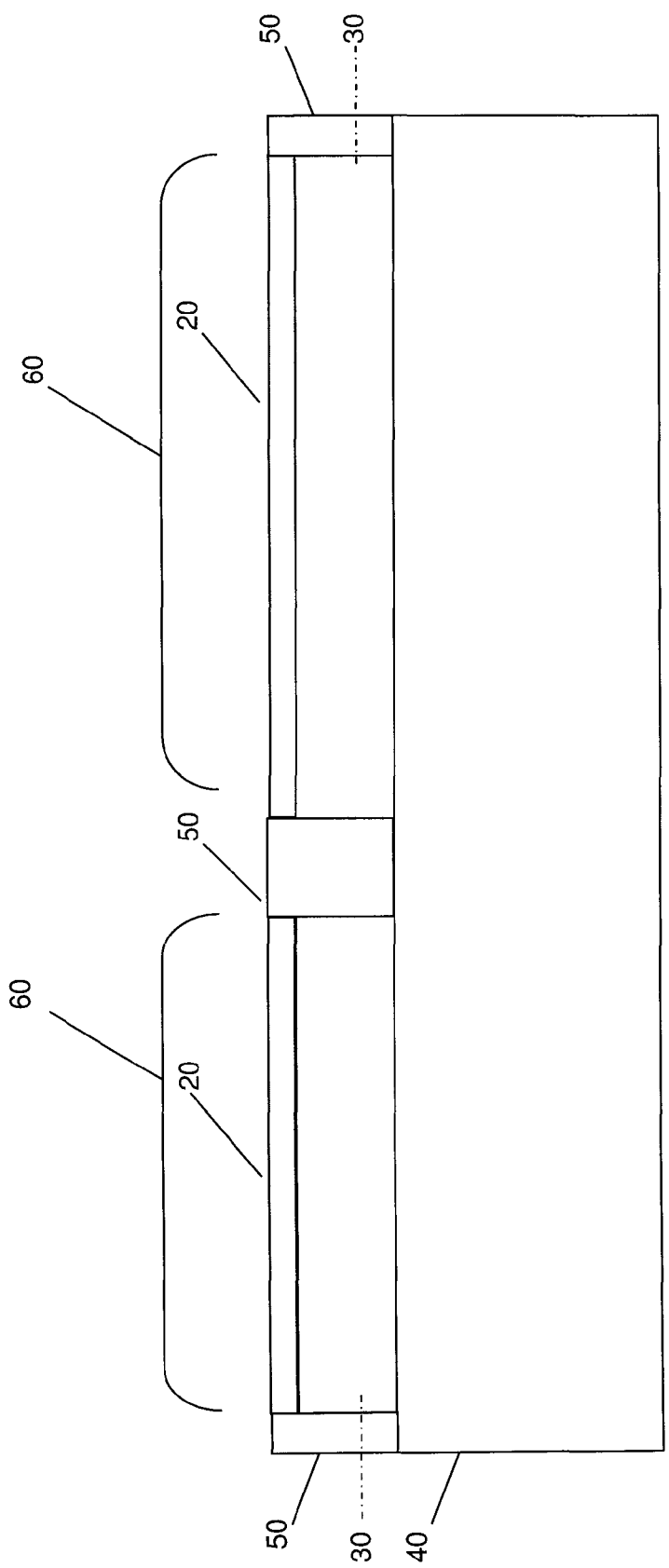
FIG. 2 illustrates the semiconductor structure after it has undergone a shallow trench isolation process, and as a result, contains shallow-trench regions therein, and can also be employed in at least one embodiment of the present application.

The semiconductor device of FIG. 1 can be processed to include at least one isolation region therein. Referring to FIG. 2, isolation regions 50 may be formed in the ETSOI substrate 10 to isolate structures formed on the ETSOI substrate 10 from adjacent structures. As stated shown in FIG. 1 and FIG. 2, in some embodiments, the ETSOI substrate 10 can further include a buried insulator layer 30, which as stated, can be made of, for example, oxides, nitrides, oxynitrides of silicon, and combinations thereof, and is preferably a buried dielectric layer such as a buried oxide layer (BOX) layer. The buried dielectric layer 30 may improve device isolation and prevent dopant diffusion. Isolation regions 50 may be formed by any known method in the art, including, for example, lithography or etching into the ETSOI substrate 10 to form trenches, and then filling the trenches with an insulating material, such as silicon dioxide. After forming isolation regions 50, an active region 60 in the ETSOI substrate 10 is defined as the region between a pair of isolation regions 50. Active region 60 may include doped and undoped regions that have been omitted from FIG. 2 for illustrative clarity.

Other embodiments may include other means of isolating structures formed on the ETSOI substrate 10, or may have isolation around none or only some structures.

The example shown above is where the at least one isolation region is a shallow trench isolation region ("STI"), but it can be a trench isolation region, a field oxide isolation region (not shown), or any other equivalent known in the art. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate structure regions, typically required when the neighboring gates have opposite conductivities, i.e., nFETs and pFETs. As such, the at least one isolation region can separate an nFET device region from a pFET device region.

Figure 3:
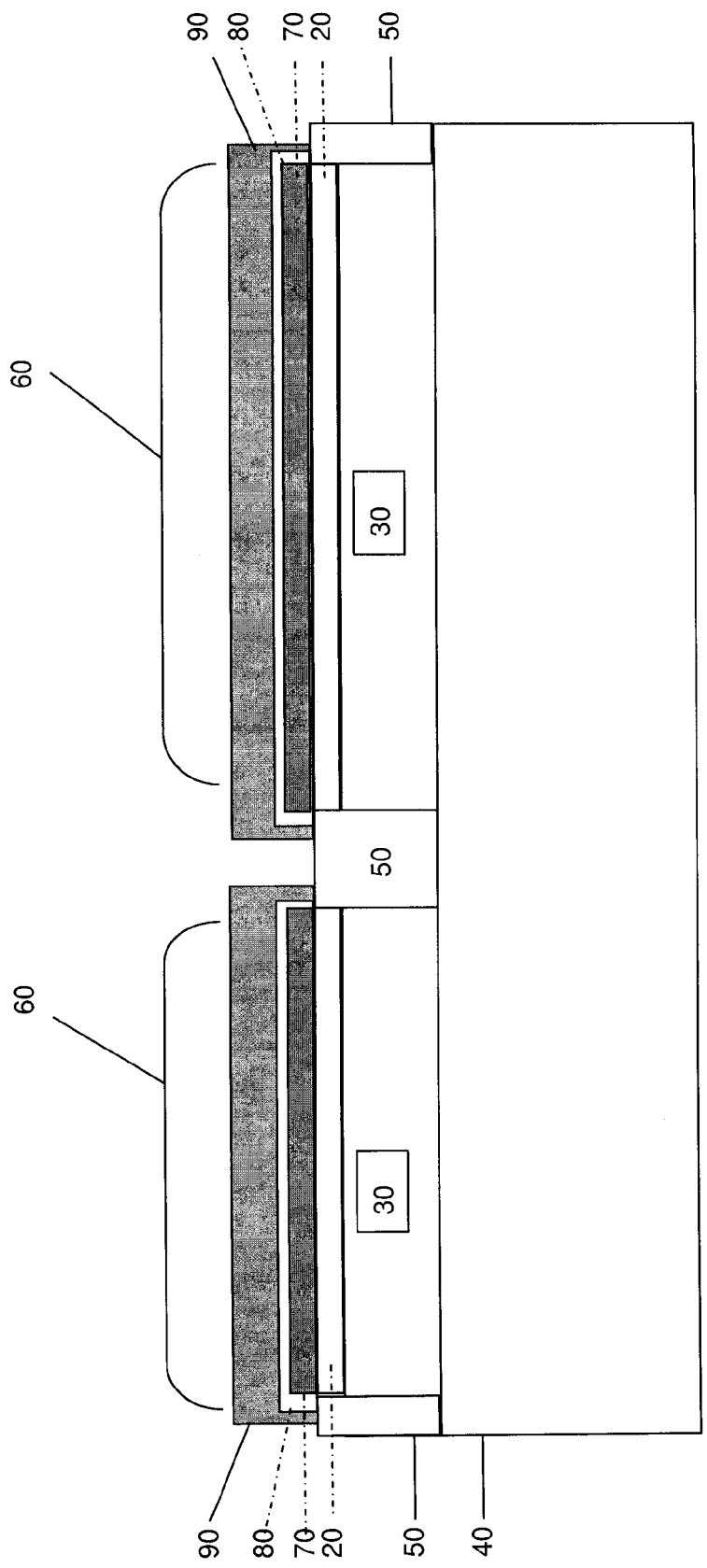
FIG. 3 illustrates the semiconductor structure having a silicon layer in-between a first SiGe layer and a second SiGe layer in a first active region and a second active region, in accordance with an embodiment of the present invention.

Referring now to FIG. 3, one aspect of an embodiment of the invention is shown. A first germanium containing silicon layer ('a first SiGe layer") 70 is epitaxially grown on each of the active regions 60. (Note that in subsequent Figures, the active regions will not be explicitly identified numerically, and are to be understood as the region between the STI layers, as mentioned above). After epitaxial deposition of the first SiGe layer 70, a layer of epitaxial silicon ("Si layer") 80 is deposited over each of the first SiGe layers 70 of the semiconductor substrate. As will be discussed, the thin Si layer 80 can operate as an etch stop layer.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the first germanium containing silicon layer 70 and the second silicon germanium containing silicon layer 80 (discussed further below include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming germanium containing silicon layer 70 and the second silicon germanium containing silicon layer 80 (discussed further below) typically ranges from 550° C. to 900° C. Although higher temperature typically results in faster deposition, the faster deposition may result in crystal defects and film cracking.

A number of different sources may be used for the deposition of the first silicon germanium containing silicon layer 70 and the second silicon germanium containing silicon layer 80 (discussed further below). In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

After epitaxial deposition of the first SiGe layers 70, a second germanium containing silicon layer 90 ("a second SiGe layer") is epitaxially deposited over each of the Si layers 80 that are over the first SiGe layers 70. The thickness of each of the first SiGe layers 70, the Si layer 80, and the second SiGe layers 90 and the concentration of Germanium in both the first SiGe layers 70 and the second SiGe layers 90 are chosen with a final product in mind, where higher germanium concentration leads to increased electron mobility, and as a general matter, different germanium concentrations allow one to tune the threshold voltage of a given device. As such, and as may be mentioned elsewhere below, the parameters mentioned in the preceding sentence are determined based on the physical properties desired in a final product. In some embodiments, the first SiGe layer 70 will have a different thickness and/or concentration of Germanium than the second SiGe layer 90, and in other embodiments, the first SiGe layer 70 will have the same concentration of Germanium and/or the same thickness. This will be discussed in greater detail below.

Epitaxial growth of the first SiGe layer 70 and the second SiGe layer 90 is preferably uniform.

The above process steps can all be performed in the same epitaxial reactor, in the same recipe during the same process run by starting with growth of the first SiGe layer 70, followed by growing the thin Si layer 80 and then continuing with the growth of the second SiGe layer 90. This feature increases efficiency and promotes economic advantage, i.e. cost reduction, by eliminating the need for an additional process run. The presence of the Si layer 80 operates as an etch stop layer as will later be shown, and obviates masking of one of the active regions while epitaxially growing the second SiGe layer 90, i.e. the second epitaxial layer, on the other active region. Processing all process steps in one process run eliminates a second independent epitaxy process run, including an epitaxial prebake to preclean the semiconductor surfaces for epitaxial processing. The prebake and preclean process are more challenging for SiGe than for Silicon due to the strain in the SiGe layers on Silicon and the tendency of strained SiGe to relax and to form defects during high temperature processing.

In other words, the presence of the Si layer 80 enables the ability to form the first SiGe layer 70, the Si layer 80, and the second SiGe layer 90 in a single process run; where epitaxial single process run means a continuous epitaxial growth process in a single epitaxial reactor, without requiring removing the ETSOI substrate 10 and reinstalling it in the same or another epitaxial reactor for further epitaxial processing.

Figure 4:
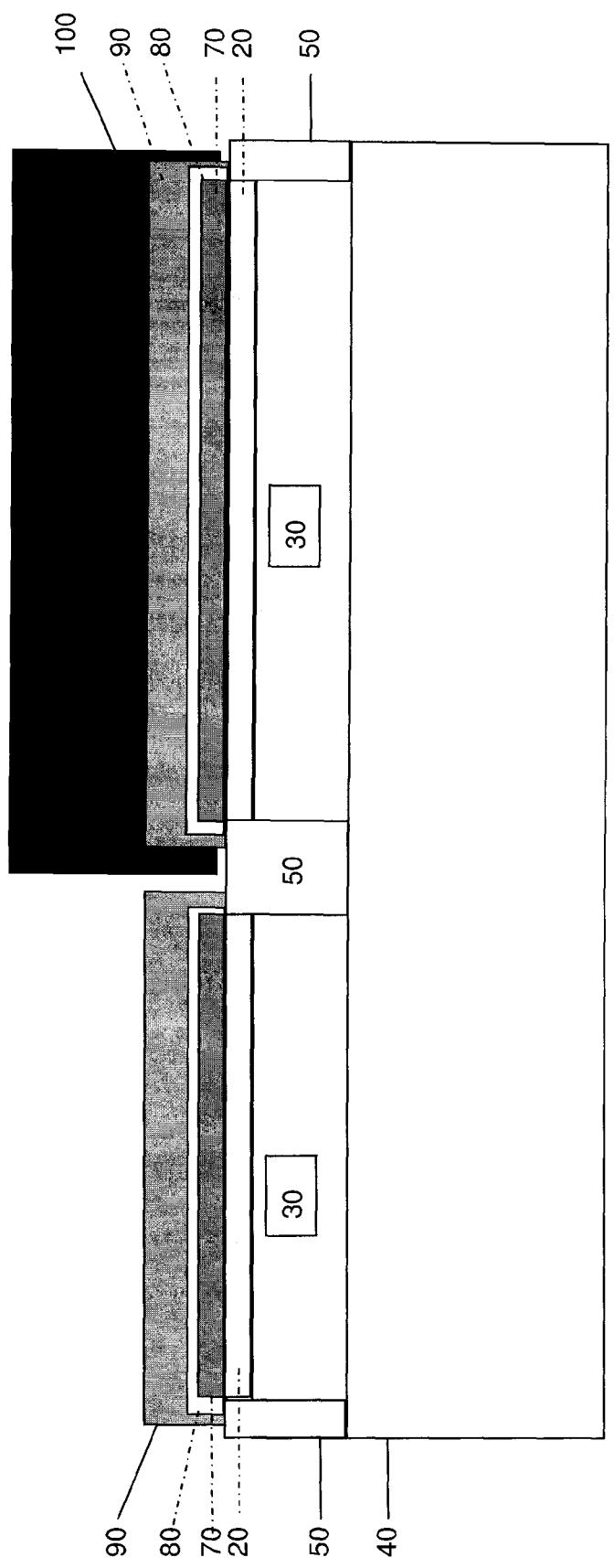
FIG. 4 illustrates a mask covering the first active region of the semiconductor structure in accordance with an embodiment of the present invention.

Referring to FIG. 4, another aspect of and embodiment of the invention is shown. A hard mask 100 is deposited over one of the active regions. (Note that FIGS. 3-7 show some lateral overgrowth with respect to the active region 30 from one or both of the SiGe layers; however, in application, the overgrowth can be negligible or non-existent.) The hard mask material can be, for example, silicon nitride and/or silicon dioxide.

Figure 5:
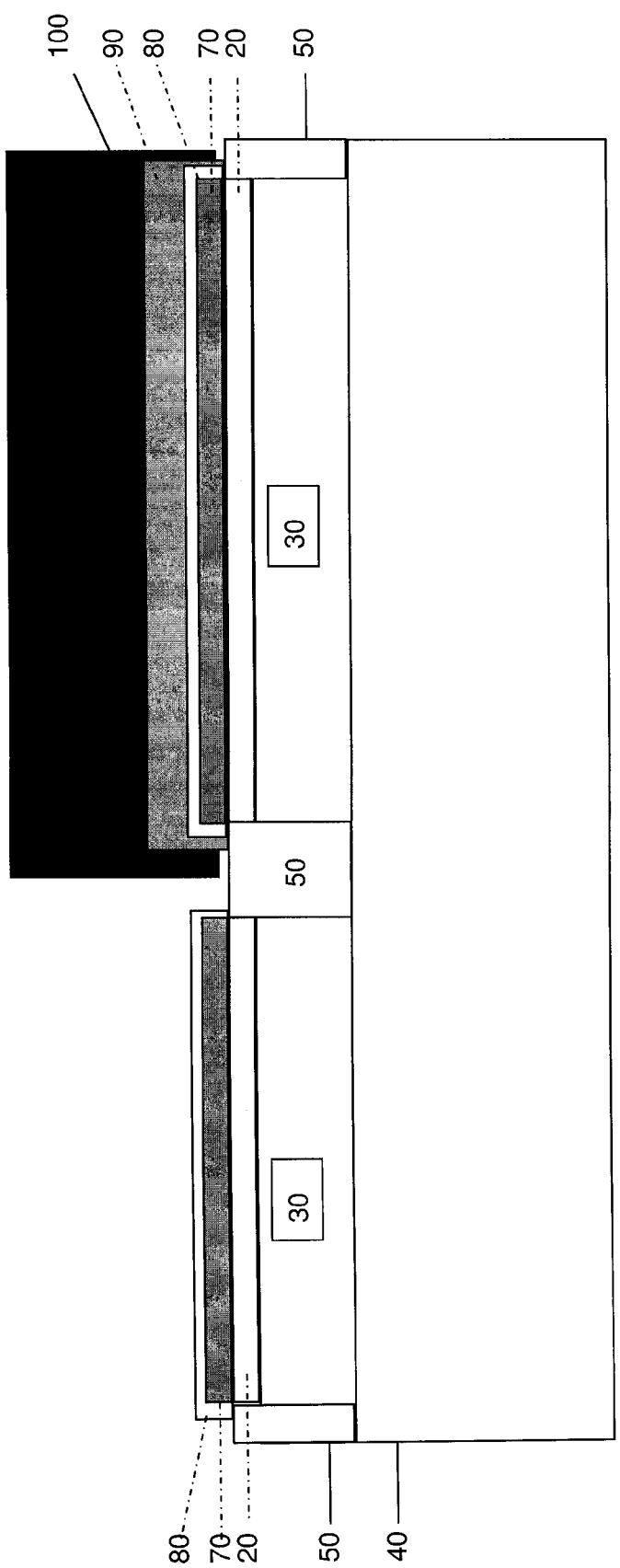
FIG. 5 illustrates the removal of the second SiGe layer from the second active region of the semiconductor structure in accordance with an embodiment of the present invention.

Referring to FIG. 5, another aspect of and embodiment of the invention is shown. The second SiGe layer 90 of one of the unmasked active regions is removed. The removal of the SiGe layer can be by gaseous HCl etch or by wet etch processing, i.e. with TMAH. Gaseous HCl etch removal is the preferred method. Moreover, as the etch process removes the second SiGe layer 90 of one of the active regions, the SiGe layers of the other active region are protected by the hardmask 100.

Figure 6:
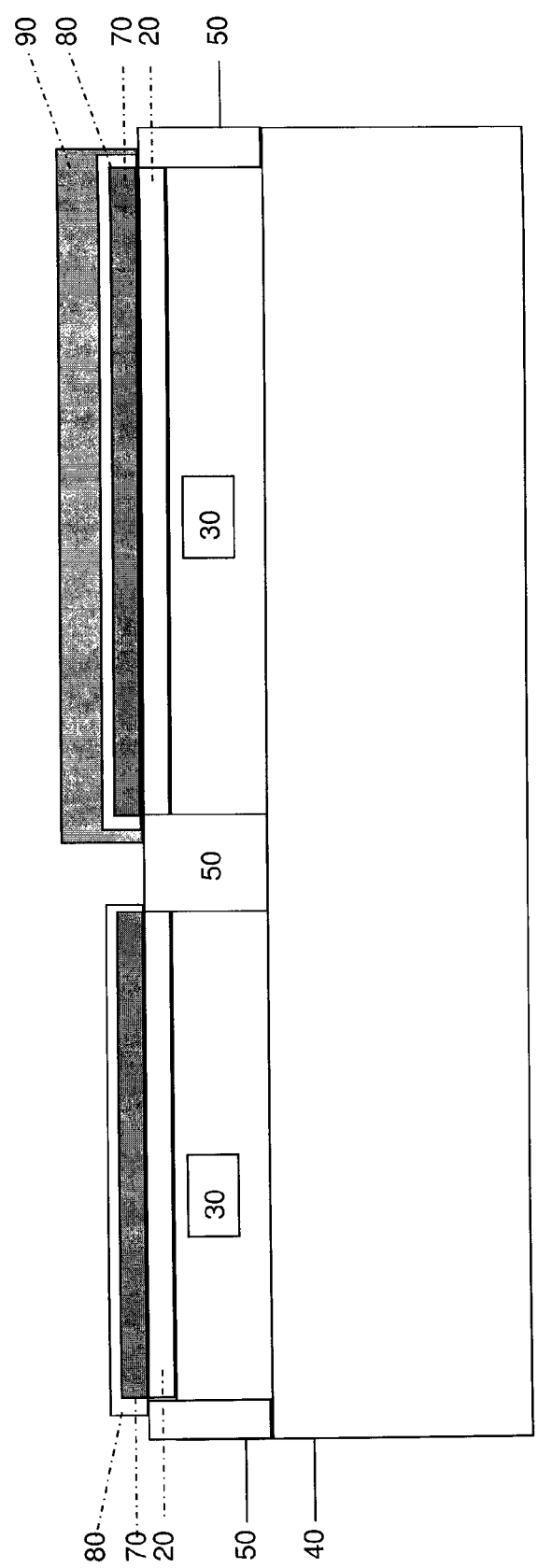
FIG. 6 illustrates the removal of the mask from the first active region of the semiconductor structure in accordance with an embodiment of the present invention.
Figure 7:
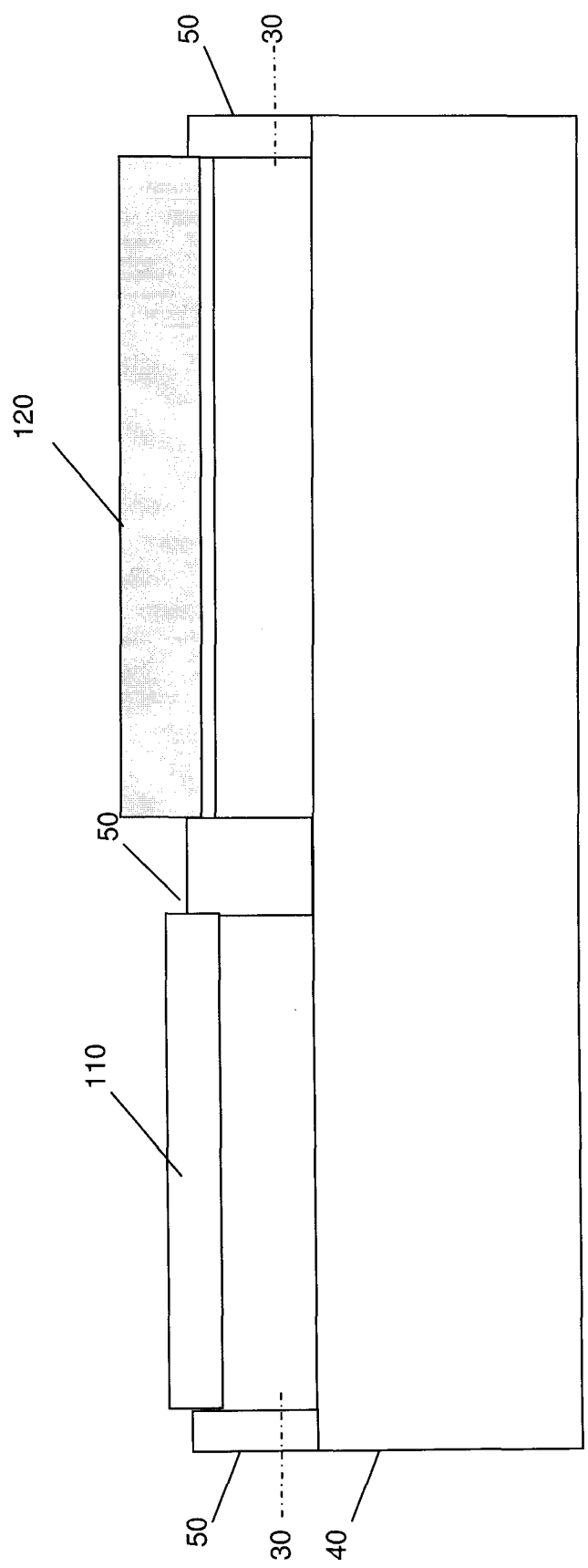
FIG. 7 illustrates thermal mixing of the first SiGe layer and the silicon layer in the first active region and the thermal mixing of the second SiGe layer, the silicon layer, and the first SiGe layer in the first active region of the semiconductor structure in accordance with an embodiment of the present invention.

With reference to FIG. 6, another aspect of an embodiment of the invention is shown, the hardmask 100 covering one of the active regions is removed. With reference to FIG. 7, another aspect of an embodiment of the invention is shown. Specifically, after the hardmask 100 is removed, the Si layer 80 and the first SiGe layer 70 remain for one of the active regions, the second SiGe layer 90 having been removed, and the Si layer 80 and both the first SiGe layer 70 and the second SiGe layer 90 of the other one of the active regions remains in place.

The remaining layers on each active region can be thermally mixed by thermally annealing them. Specifically, in the active region that has the second SiGe layer 90 removed, the semiconductor material layer 20 of the ETSOI substrate 10 in that region, the first SiGe layer 70, and the Si layer 80 will thermally mix to form one final, merged, SiGe layer 110. The anneal process can be furnace anneal, rapid thermal anneal, flash anneal, or any suitable combination of those processes. The anneal temperature ranges from 600 degrees to 1300 degrees Centigrade. The anneal time ranges from 1 millisecond to 2 hours, depending on the anneal temperature. Higher anneal temperatures require shorter anneal times. A typical anneal condition is about 30 minutes at 1000° C.

Figure 8:
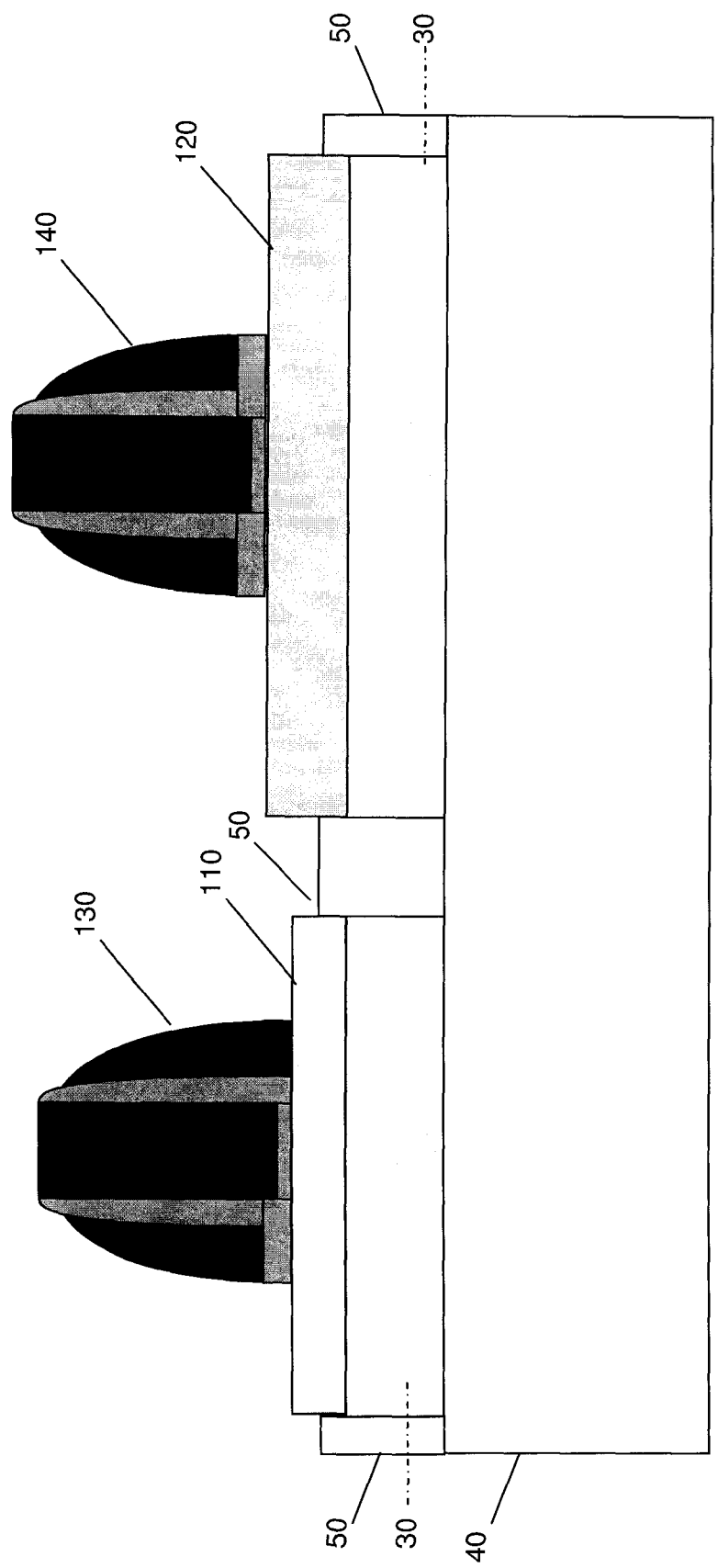
FIG. 8 illustrates the formation of a device in the first active region and a device in the second active region of the semiconductor structure in accordance with an embodiment of the present invention.

As shown in FIG. 8, which demonstrates another aspect of an embodiment of the invention, such annealing causes the mixing of the first SiGe layer 70 and the Si 80 layer of one active region and the semiconductor material layer 20 of the ETSOI substrate 10 in that region, forming one merged SiGe layer 110 on one of the active regions. Furthermore, such annealing causes the mixing of the first SiGe layer 70, the Si 80 layer, the semiconductor material layer 20 of the ETSOI substrate 10 in that region and the second SiGe layer 90 of the other active region and the semiconductor material layer 20 of the ETSOI substrate 10 in that region, forming another merged SiGe layer 120 on one of the active regions.

Essentially, two active regions with ETSGOI layers 110 and 120 with different Germanium concentrations are formed. Accordingly, one aspect of an embodiment of the present invention produces a substrate that has active regions with two distinct SiGe layers with different Germanium concentrations.

The resulting merged SiGe layer 110, which had its second SiGe layer removed, will usually have a lower Germanium content than the first SiGe layer 70 before the mixing. The reason for this is that the thin Si layer 80 and the semiconductor material layer 20 of the ETSOI substrate 10 reduce the overall Germanium content when mixed with the first SiGe layer 70. (This is the case when the semiconductor material layer 20 is pure silicon or primarily silicon). However, with respect to the thermal annealing of the layers of the other active region, since the first SiGe layer 70, the Si layer 80, the second SiGe layer 90 and the ETSOI 20 will be thermally mixed, it is possible, depending on the selection of the thickness of each of the layers and the concentration of Germanium in each of the SiGe layers, for the second merged SiGe layer 120 to have a higher or lower concentration of Germanium than each of the first SiGe layer 70 and the second SiGe layer 90, which were originally present in the active regions. In other words, it is possible to create any number of variations for the final Germanium content of the final merged layers 110 and 120 by selecting the thickness of the ETSOI layer 20 and the thin Si layer 80, and by selecting the thickness and/or the Germanium concentration of the First SiGe layer 70 and the second SiGe layer 80; however, the final two thermally mixed SiGe layers, SiGe layer 110 and SiGe layer 120, will usually have different Germanium contents because one of the active regions at the thermal mixing stage has the extra SiGe layer 90.

As stated and implied above during the discussion of FIG. 4, the Germanium content of the final thermally mixed silicon germanium layers can be engineered as desired for particular applications by ensuring that the initial deposited germanium containing layers have an appropriate germanium content and/or thickness for the particular application desired.

In an instance where a higher Germanium content is desired, the thin Si layer 80 will be very thin, ranging from 1-2 nm. For the particular embodiment where the thin Si layer 80 is between 1-2 nm, substantial benefit is obtained in that it reduces the dilution effect on the overall SiGe concentration while still affording some of the benefits of the described herein, including the reduced process steps, which is possible at least due to the thin Si layer's 80 function as an etch stop layer.

In one particular embodiment, the thickness of the semiconductor material layer 20 of the ETSOI substrate 10 is 6 nm, the thickness of the first SiGe layer 70 of both active regions is 4 nm, with a Germanium concentration of 35%, the thickness of the thin Si layer 80 is 2 nm, and the thickness of the second SiGe layer 90 is 5 nm, with a Germanium concentration of 60%. After undergoing the process steps described above, including the removal of the second SiGe layer 90 for one of the active regions and the thermal mixing of the various layers as described above, one active region will have a final merged SiGe layer 110 with a thickness of 12 nm and a Germanium concentration of about 12%, and the other active region will have a final merged SiGe layer 120 with a thickness of 17 nm and a Germanium concentration of about 25%.

In another particular embodiment, the thickness of the semiconductor material layer 20 of the ETSOI substrate 10 is 4 nm, the thickness of the first SiGe layer 70 of both active regions is 6 nm, with a Germanium concentration of 40%, the thickness of the thin Si layer 80 is 2 nm, and the thickness of the second SiGe layer 90 is 6 nm, with a Germanium concentration of 40%. After undergoing the process steps described above, including the removal of the second SiGe layer 90 for one of the active regions and the thermal mixing of the various layers as described above, one active region will have a final merged SiGe layer 110 with a thickness of 12 nm and a Germanium concentration of about 20%, and the other active region will have a final merged SiGe layer 120 with a thickness of 18 nm and a Germanium concentration of about 33%.

Although the particular embodiments have both the first SiGe layer 70 and the second SiGe layer 90 as being of the same thickness, it is possible to arrive at configurations where the thicknesses differ from one another. It is also possible to vary the thickness of the thin Si layer 80 and the semiconductor material layer 20 of the ETSOI substrate 10 in relation to one another and in relation to the SiGe layers. The same applies with respect with the initial concentration of the germanium content of the first SiGe layer 70 and the second SiGe layer 90, i.e. they do not have to be the same.

In one embodiment, one of the SiGe layers has the same thickness as the semiconductor material layer 20 of the ETSOI substrate 10. In one embodiment, one of the SiGe layers has a thickness that is less than the semiconductor material layer 20 of the ETSOI substrate 10. In yet another embodiment, one of the SiGe layers has a thickness that is greater than the semiconductor material layer 20 of the ETSOI substrate 10.

In yet another embodiment, the semiconductor material layer 20 of the ETSOI substrate 10, which as stated is preferably made of pure silicon or a material primarily made of silicon, and whether it is of the same as one of the SiGe layers or otherwise, is made as thin as possible, i.e. 3-4 nm, to reduce the amount of dilution from the pure silicon in forming higher percentage SiGe layers.

With reference to FIG. 8, another aspect of the invention is shown. Once the final merged SiGe layers, layer 110 and 120, are prepared in the respective active regions, devices may be placed over layer 110 and 120. In the example of FIG. 8, two pFET devices are shown 130 and 140 devices are provided as the examples in FIG. 8.

It should be understood that although the particular examples and figures provided above refer to two active regions on a particular substrate, the principles of this invention can be applied to two or more, including some or all, of the active regions of a given substrate. Moreover, the various embodiments referring to dimensional or concentration (such as Germanium concentration) limitations can be combined and are non-limiting, unless their combination is logically/physically impossible or expressly disproved. For instance, a hybrid embodiment with one of the deposited SiGe layers having a thickness less than the semiconductor material layer 20 of the ETSOI substrate 10 and another one of the deposited SiGe layer having a thickness greater than the semiconductor material layer 20 of the ETSOI substrate 10, with Germanium concentrations being the same or different. Again, this is a non-limiting example, and any combination can be formed based on the embodiments described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
providing an extremely-thin-semiconductor-on-insulator (ETSOI) substrate with at least two active regions, the ETSOI substrate having a semiconductor material layer having a thickness between 1 nm and 10 nm;
depositing a first SiGe layer over each of the at least two active regions;
depositing a Si layer over each of the SiGe layers;
depositing a second SiGe layer over each of the Si layers;
depositing a hard mask over one of the at least two active regions, a other of the at least two active regions is not covered by the deposited hard mask;
removing the deposited second SiGe layer associated with the other of the at least two active regions;
removing the deposited hard mask; and
thermally mixing remaining Si and SiGe layers of the at least two active regions to form a new SiGe layer with a first uniform Germanium concentration for one of the at least two active regions, another new SiGe layer with a second uniform Germanium concentration for another one of the at least two active regions, wherein the first uniform Germanium concentration is different from the second uniform Germanium concentration.

2. The method according to claim 1 further comprising the step of:
selecting a composition of both the deposited first SiGe layer and the deposited second SiGe layer such that one of: i) concentration of Germanium in the deposited first SiGe layer and concentration of Germanium in the deposited second SiGe layer is different, ii) thickness of the deposited first SiGe layer is different than thickness of the deposited second SiGe layer, or iii) the concentration of Germanium in the deposited first SiGe layer and the concentration of Germanium in the deposited second SiGe layer is different and the thickness of the deposited first SiGe layer is different than the thickness of the deposited second SiGe layer.

3. The method according to claim 2, wherein the concentration of Germanium in the first SiGe layer is different than the concentration of Germanium in the second SiGe layer.

4. The method according to claim 3, wherein the deposited first SiGe layer has a different thickness than the deposited second SiGe layer.

5. The method according to claim 3, wherein at least one of the deposited SiGe layers has a thickness equivalent to a thickness of an ETSOI portion of the ETSOI substrate.

6. The method according to claim 3, wherein at least one of the deposited SiGe layers has a thickness less than a thickness of an ETSOI portion of the ETSOI substrate.

7. The method according to claim 3, wherein at least one of the deposited SiGe layers has a greater thickness than a thickness of an ETSOI portion of the ETSOI substrate.

8. The method according to claim 3, wherein the Si layers are between 1-2 nm in thickness.

9. The method according to claim 3, wherein the first deposited SiGe layer comprises 10% to 99% Germanium and the second deposited SiGe layer comprises 10% to 99% Germanium.

10. The method according to claim 9, wherein the new SiGe layer with uniform Germanium concentration of one of the at least two active regions has a Germanium concentration between 10% to 30% Germanium, and wherein the new SiGe layer with uniform Germanium concentration of the other one of the that at least two active regions has a Germanium concentration between 25% to 50% Germanium.

11. The method according to claim 9, wherein the new SiGe layer with uniform Germanium concentration of one of the at least two active regions has a Germanium concentration between 20% to 40% Ge, and wherein the new SiGe layer with uniform Germanium concentration of the other one of the at least two active regions has a Germanium concentration between 35% to 60% Ge.

12. The method according to claim 1, wherein the thickness of each of the final layer merged SiGe layers does not exceed 30 nm in thickness.

13. The method according to claim 1, wherein the thickness difference between the final merged SiGe layers does not exceed 10 nm.

14. A method comprising:
providing an extremely-thin-semiconductor-on-insulator (ETSOI) substrate with at least two active regions, the ETSOI substrate having a semiconductor material layer having a thickness between 1 nm and 10 nm;

epitaxially growing a first SiGe layer over each of the at least two active regions;

depositing a Si layer over each of the SiGe layers;

epitaxially growing a second SiGe layer over each of the Si layers;

depositing a hard mask over only the second SiGe layer of one of the at least two active regions;

removing the deposited second SiGe layer associated with an unmasked active region of the at least two active regions;

removing the deposited hard mask; and thermally mixing the remaining Si and SiGe layers of the at least two active regions to form a new SiGe layer with uniform Germanium concentration for each of the at least two active regions, wherein the new SiGe layer with uniform Germanium concentration of one of the at least two active regions has a different concentration of Germanium than the new SiGe layer with uniform Germanium concentration of the other SiGe layer, wherein the deposition of the first SiGe layer, the Si layer, and the second SiGe layer occur in a single epitaxial process run.

15. The method according to claim 14, wherein the Si layer functions as an etch stop during the epitaxial deposition of the second SiGe layer over each of the at least two active regions.

16. The method according to claim 15, wherein the concentration of Germanium in the first SiGe layer is different than the concentration of Germanium in the second SiGe layer.

\* \* \* \* \*